(12) United States Patent
Ohmae

(10) Patent No.: US 10,535,563 B2
(45) Date of Patent: Jan. 14, 2020

(54) PROCESSING METHOD FOR SUBSTRATE HAVING METAL EXPOSED

(71) Applicant: DISCO CORPORATION, Tokyo (JP)

(72) Inventor: Makiko Ohmae, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/050,068

(22) Filed: Jul. 31, 2018

(65) Prior Publication Data

US 2019/0051560 A1 Feb. 14, 2019

(30) Foreign Application Priority Data

Aug. 8, 2017 (JP) .................................. 2017-153170

(51) Int. Cl.
*H01L 21/78* (2006.01)
*H01L 23/373* (2006.01)
*H01L 23/14* (2006.01)

(52) U.S. Cl.
CPC .............. *H01L 21/78* (2013.01); *H01L 23/14* (2013.01); *H01L 23/3736* (2013.01)

(58) Field of Classification Search
None
See application file for complete search history.

(56) References Cited

U.S. PATENT DOCUMENTS

| 10,403,520 | B2* | 9/2019 | Jang | |
|---|---|---|---|---|
| 2009/0042368 | A1* | 2/2009 | Sekiya | H01L 21/3065 438/460 |
| 2014/0315350 | A1* | 10/2014 | Xue | H01L 24/11 438/110 |

FOREIGN PATENT DOCUMENTS

| JP | 2003092303 A | 3/2003 |
|---|---|---|
| JP | 2009229641 A | 10/2009 |
| JP | 2009237067 A | 10/2009 |
| JP | 2011018792 A | 1/2011 |

* cited by examiner

*Primary Examiner* — Thien F Tran
(74) *Attorney, Agent, or Firm* — Greer Burns & Crain Ltd.

(57) ABSTRACT

A processing method for a substrate having a metal exposed and having cutting lines of a predetermined width set thereon includes: a structural body disposing step of disposing two structural bodies on the metal along respective edges in regard of the width direction of the cutting line, with a gap corresponding to the width therebetween; and a cutting step of causing a cutting blade to cut into the substrate from between the two structural bodies to cut the substrate along the cutting lines, after the structural body disposing step is carried out.

2 Claims, 3 Drawing Sheets

PROCESSING METHOD FOR SUBSTRATE HAVING METAL EXPOSED

BACKGROUND OF THE INVENTION

Field of the Invention

The present invention relates to a processing method for a substrate having a metal exposed.

Description of the Related Art

A front surface of a substantially circular disk-shaped substrate of a semiconductor is partitioned by a plurality of cutting lines arranged in a grid pattern, and a device such as an IC (Integrated Circuit) is formed in each of the thus partitioned regions. When the substrate is finally cut along the cutting lines, individual device chips are formed. In recent years, attendant on reductions in the size and thickness of electronic apparatuses, there has been an increasing demand for reductions in the size and thickness of device chips to be mounted on the electronic apparatuses. In order to form thin type device chips, for example, a back surface of a substrate formed with a plurality of devices on a front surface thereof is ground to thin the substrate to a predetermined thickness, and thereafter the substrate is cut along the cutting lines.

The thin type device chip thus formed may be lower in mechanical strength than a device chip having a certain extent of thickness. Therefore, there is a possibility that the thin type device chip may be damaged during a period from the formation of the thin type device chip to the mounting thereof onto a predetermined object of mounting. In view of this, there has been developed a technology in which a metal serving as a reinforcement member is preliminarily disposed on the back surface side of the substrate before cutting of the substrate, and the substrate is cut together with the metal to manufacture individual device chips (see Japanese Patent Laid-Open No. 2003-92303 and Japanese Patent Laid-Open No. 2011-18792). In addition, optical devices such as LEDs (Light Emitting Diodes) may be formed from a substrate. Since the optical device generates heat together with light, a metal functioning as a radiator plate (heat sink) for easy radiation of heat may be formed on the back surface side of the optical device. For example, a technology has been developed in which the metal is disposed on the back surface side of the substrate before cutting of the substrate, and the substrate is cut together with the metal to form individual optical device chips (see Japanese Patent Laid-Open No. 2009-229641 and Japanese Patent Laid-Open No. 2009-237067).

SUMMARY OF THE INVENTION

The cutting of the substrate is carried out, for example, by use of an annular cutting blade. When the cutting blade in rotation is made to cut into the substrate from the back surface side along the cutting line, the substrate is cut. In the case where the substrate having the metal exposed is cut by the cutting blade from the back surface side on which the metal is exposed, a projection called burr extending from the cut portion may be formed, and the burr may be left at an end portion of the device chip. If the burr is left on the device chip, there is a fear that, for example, when the device chip thus formed is mounted to a predetermined object of mounting, the burr may interfere with the object to hamper appropriate mounting of the device chip. In addition, the burr may extend in such a manner as to interconnect electrodes of the device chip, causing a short-circuit between the electrodes. Further, the burr thus formed may fall off and adhere to the device chip or the cutting apparatus.

The present invention has been made in consideration of the above-mentioned problems. It is therefore an object of the present invention to provide a processing method which makes it possible to restrain remaining of metallic burr generated when a substrate having a metal exposed is cut by a cutting blade.

In accordance with an aspect of the present invention, there is provided a processing method for a substrate having a metal exposed and having cutting lines of a predetermined width set thereon, the processing method including: a structural body disposing step of disposing two structural bodies on the metal along respective edges in regard of width direction of the cutting line, with a gap corresponding to the width therebetween; and a cutting step of causing a cutting blade to cut into the substrate from between the two structural bodies to cut the substrate along the cutting lines, after the structural body disposing step is carried out.

Preferably, the cutting blade has an annular cutting grindstone, and the distance between the two structural bodies is equal to or smaller than the thickness of the cutting grindstone.

In the processing method according to a mode of the present invention, the structural body disposing step of disposing the two structural bodies is carried out before conducting the cutting step of cutting the substrate having the metal exposed along the cutting lines by the cutting blade. The two structural bodies are disposed along respective edges in regard of width direction of the cutting line on the metal. In other words, the two structural bodies are each disposed on the upper side of both wall surfaces of the metal exposed to a region to be removed by cutting of the metal with the cutting blade in the cutting step. In the cutting step, the cutting blade is passed between the two structural bodies and is made to cut into the substrate, thereby cutting the substrate along the cutting line. As a result, when the burr is generated from both wall surfaces of the metal, the burr is crushed between the cutting blade and the structural bodies, so that the burr would not be left on the device chip formed by the cutting step.

Consequently, in accordance with a mode of the present invention, there is provided a processing method which makes it possible to restrain remaining of metallic burr generated when a substrate having a metal exposed is cut by a cutting blade.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
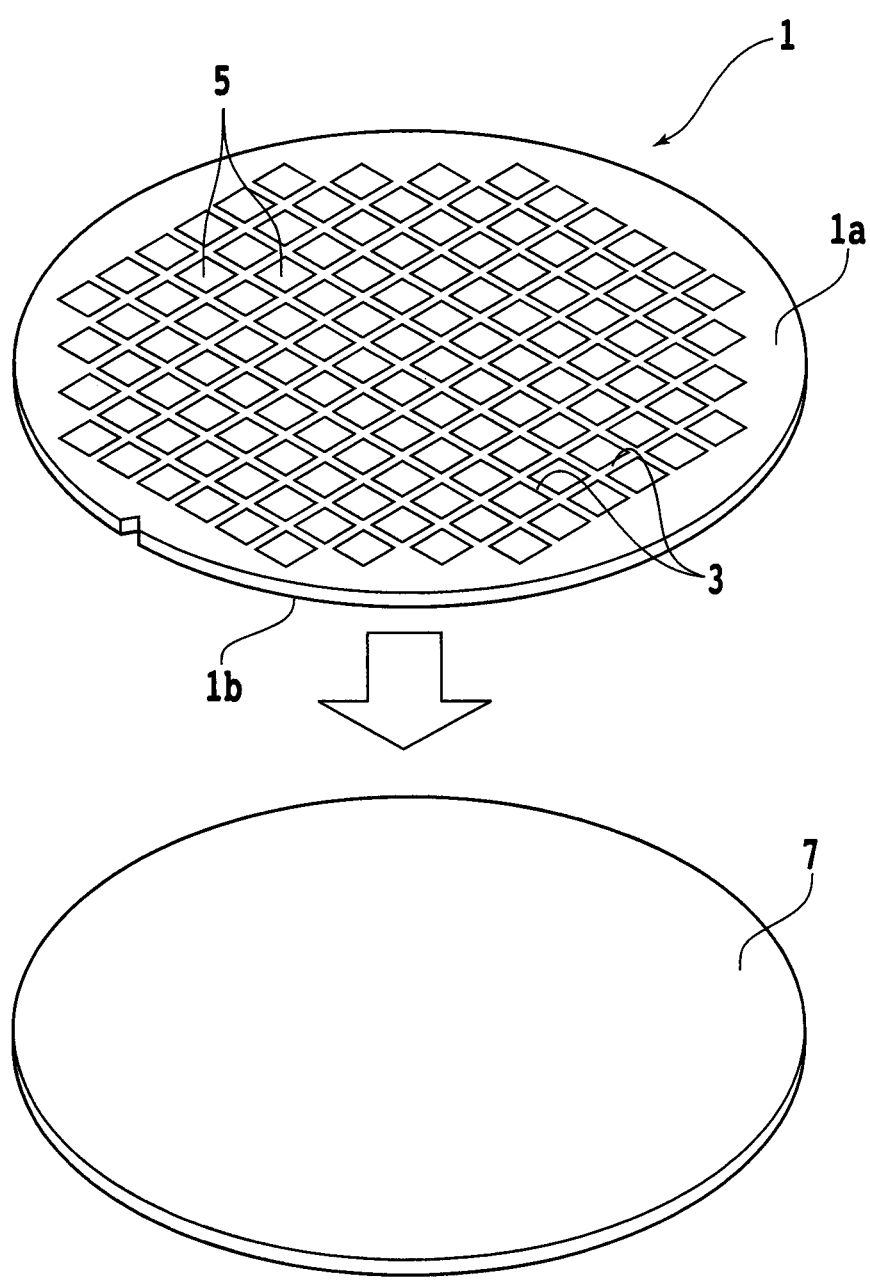
FIG. 1 is a perspective view depicting schematically disposition of a metal to a back surface of a substrate.

An embodiment of the present invention will be descried referring to the attached drawings. First, a substrate having a metal exposed that is a workpiece in a processing method according to the present embodiment will be described. The substrate having the metal exposed is a plate-shaped substrate such as a semiconductor substrate or a glass substrate having a metal disposed at an outer surface thereof, or a metallic substrate formed of a metal, or the like. FIG. 1 is a perspective view depicting schematically disposition of a metal to a back surface of a substrate. An example of the substrate having the metal exposed which is the workpiece in the processing method according to the present embodiment is formed, for example, by disposing a metallic substrate 7 on a back surface 1b of a substrate 1, as depicted in FIG. 1. The substrate 1 is, for example, a substantially circular disk-shaped semiconductor wafer, in which a device 5 such as an IC or an LED is formed in each of regions partitioned by a plurality of cutting lines 3 arranged in a grid pattern on a front surface 1a. It is to be noted here, however, that the substrate 1 is not limited to the semiconductor wafer, but may be a circular disk-shaped substrate formed of a conductor such as a metal or an insulator such as a glass.

The substrate 1 is thinned by grinding from the back surface 1b side. Then, the substrate 1 is cut along the cutting lines 3, whereon individual device chips are formed. The device chips formed by cutting the thinned substrate 1 are thin type device chips. The thin type device chips tend to be low in strength as compared to device chips that have a certain extent of thickness. In addition, device chips including optical devices may be formed from the substrate 1. The optical device generates heat together with light. In view of this, in order to reinforce the device chips or to make the device chips radiate heat, a metal is disposed on the back surface 1b side of the substrate 1 to form a substrate 1 having the metal exposed, and this substrate 1 is cut to form the device chips. As a result, device chips including metals are formed. The metal functions as a reinforcement member for the device, or as a radiator plate (heat sink) of the device chip.

Figure 2A:
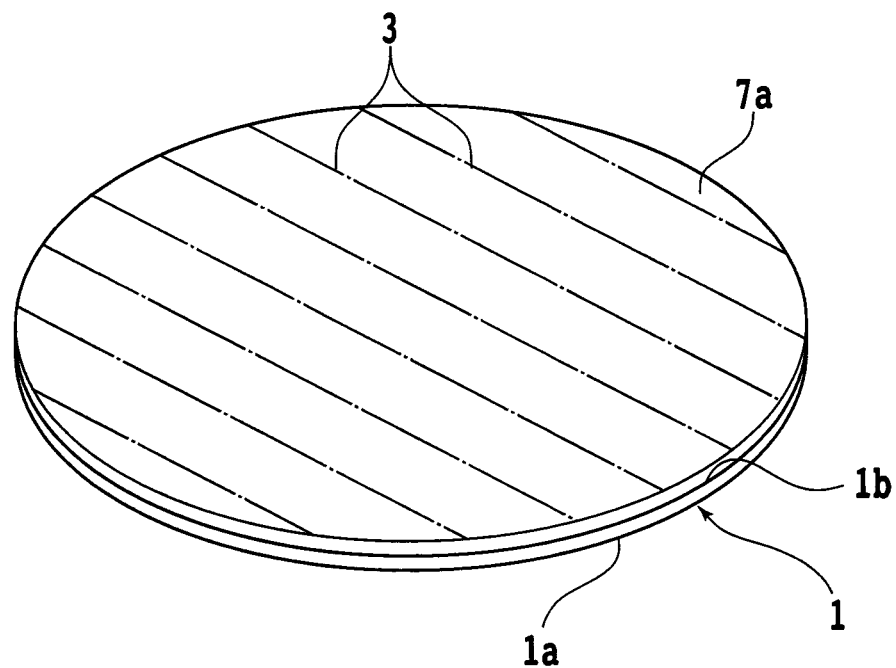
FIG. 2A is a perspective view depicting schematically the substrate having the metal exposed.

The metal is composed, for example, of gold, silver, copper, aluminum, or nickel. In order to form the substrate 1 having the metal exposed, for example, a substantially circular disk-shaped metallic substrate 7 having a surface of substantially the same shape and size as those of the front surface 1a and the back surface 1b of the substrate 1 is adhered to the back surface 1b of the substrate 1. Note that the metal may be disposed on the substrate 1 by forming a metallic film on the back surface 1b side of the substrate 1 by a vapor deposition method, a CVD (Chemical Vapor Deposition) method or the like. FIG. 2A is a perspective view depicting schematically the substrate 1 having a metal 7a exposed.

A processing method for the substrate 1 having the metal 7a exposed according to the present embodiment will be described below. In the processing method, the substrate 1 having the metal 7a exposed as depicted in FIG. 2A is cut along the cutting lines 3 by use of an annular cutting blade. In the case of cutting the substrate 1 having the metal 7a exposed by the cutting blade from the back surface 1b side on which the metal 7a is exposed, the cutting blade is made to cut into the metal 7a. When the metal 7a is cut by the cutting blade, however, a metallic projection called burr which extends from the cut portion may be formed, and the burr may be left at an end portion of the device chip. When the burr is left on the formed device chip, there is a fear that, for example, at the time of mounting the device chip to a predetermined object of mounting, the burr may interfere with the object to hamper appropriate mounting of the device chip. In addition, there is a risk that the burr extends in such a manner as to interconnect electrodes of the device chip, causing a short-circuit between the electrodes. Further, the formed burr may fall off and adhere to the device chip or a cutting apparatus. In consideration of these problems, in the processing method according to the present embodiment, a structural body disposing step of disposing two structural bodies is conducted before cutting the substrate 1 having the metal 7a exposed.

Figure 2B:
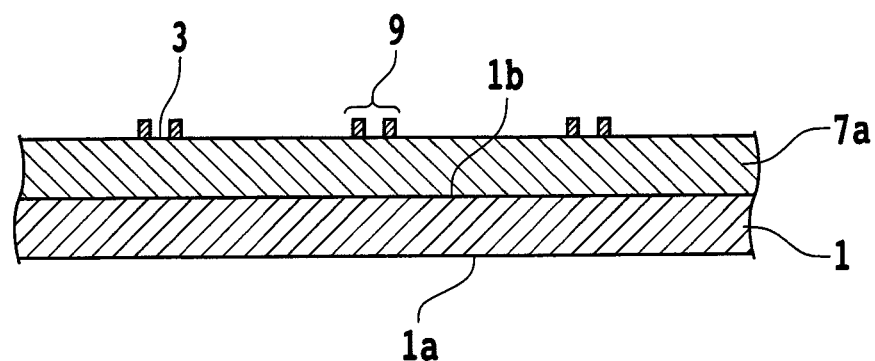
FIG. 2B is a sectional view depicting schematically the substrate having the metal exposed.

FIG. 2B is a sectional view depicting schematically the substrate 1 with two structural bodies 9 disposed along the cutting lines 3 on the metal 7a of the substrate 1. The two structural bodies 9 are formed at positions on opposite sides of the cutting line 3, as the substrate 1 is viewed from the back surface 1b side (the metal 7a side). More specifically, the structural bodies 9 are each formed on the upper side of both wall surfaces 7b (see FIG. 3B) of the metal 7a exposed to the inside of each of cut grooves 11 (see FIGS. 3A and 3B) formed by cutting the substrate 1 having the metal 7a exposed, in a cutting step which will be described later.

The structural bodies 9 are formed of, for example, a metal such as gold, silver, copper, aluminum and nickel, or an organic resin or the like. The structural bodies 9 are members having such a hardness that burr generated from the wall surfaces 7b of the metal 7a in the cutting step to be described later can be crushed between the structural bodies 9 and the cutting blade. In the case where a metal is used to form the structural bodies 9, the structural bodies 9 may be members formed of the same material as the metal 7a. In addition, in the case of using a metal to form the structural bodies 9, the structural bodies 9 may be formed, for example, by a method in which a film serving as a base for the structural bodies 9 is formed on the metal 7a by a sputtering method or a CVD method, and unrequired-portions of the film are removed by wet etching or dry etching. Alternatively, the film serving as a base for the structural bodies 9 may be cut by a cutting blade to remove unrequired portions of the film, thereby forming the structural bodies 9. In the case where an organic resin is used to form the structural bodies 9, the structural bodies 9 may be formed, for example, of a solid wax that is used at the time of fixing the substrate 1 to a predetermined object when cutting or polishing the substrate 1. Besides, in the case of using an organic resin to form the structural bodies 9, the organic resin may be applied to the metal 7a and unrequired portions thereof may be removed by a cutting blade to form the structural bodies 9 in a predetermined shape. Alternatively, the organic resin may be applied to the metal 7a and, thereafter, the structural bodies 9 of a predetermined shape may be formed by a photolithographic step.

Figure 3A:
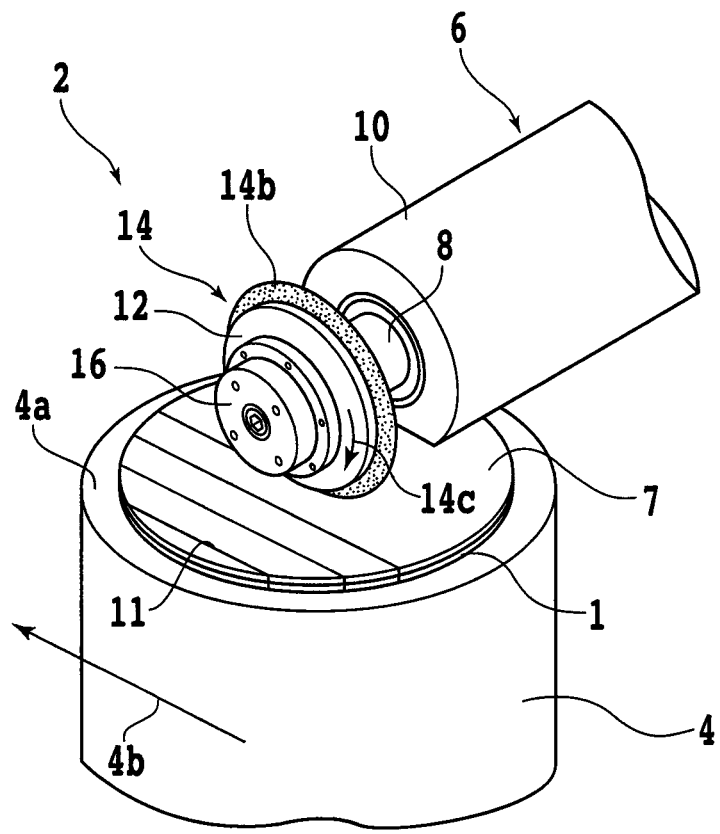
FIG. 3A is a perspective view depicting schematically cutting of the substrate having the metal exposed by a cutting blade.
Figure 3B:
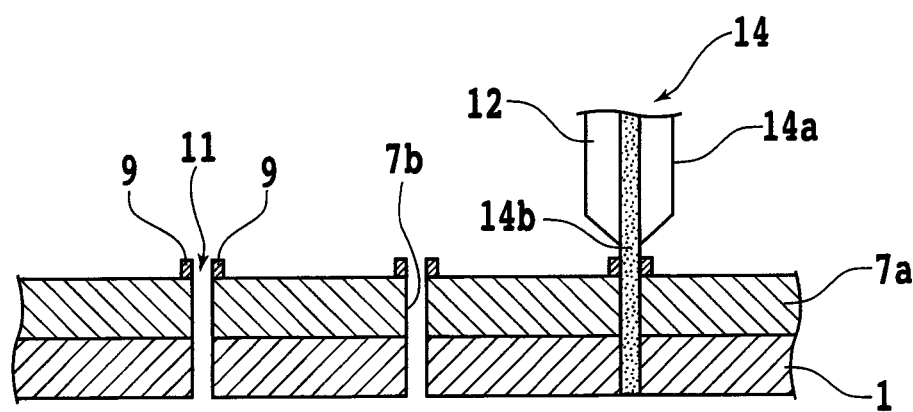
FIG. 3B is a sectional view depicting schematically the cutting of the substrate having the metal exposed by the cutting blade.

A cutting step in the processing method according to the present embodiment will be described below. FIG. 3A is a perspective view depicting schematically cutting of the substrate 1 having the metal 7a exposed by the cutting blade, and FIG. 3B is a sectional view depicting schematically the cutting of the substrate 1 having the metal 7a exposed by the cutting blade.

In the cutting step, a cutting apparatus 2 depicted in FIG. 3A is used. The cutting apparatus 2 will be described. The cutting apparatus 2 includes a chuck table 4 that holds the substrate 1, and a cutting unit 6 that performs cutting of the substrate 1 held by the chuck table 4. An upper surface of the chuck table 4 is a holding surface 4a for holding the substrate 1. The holding surface 4a is connected to a suction source (not depicted) through, for example, a suction passage (not depicted) formed in the inside of the chuck table 4. The substrate 1 is placed on the holding surface 4a, and the suction source is operated to apply a negative pressure to the substrate 1 through the suction passage, whereon the substrate 1 is held on the chuck table 4 by suction. In addition, the chuck table 4 is movable in a direction parallel to the holding surface 4a, and the direction is a processing feed direction 4b of the substrate 1. Further, the chuck table 4 can be rotated about an axis perpendicular to the holding surface 4a, and, when the chuck table 4 is rotated, the processing feed direction of the substrate 1 can be changed.

The cutting unit 6 has a spindle housing 10 fixed to a moving mechanism (not depicted) that moves the cutting unit 6 in the vertical direction. A spindle 8 is rotatably supported on the spindle housing 10. A cutting blade 14 is mounted to a tip portion (front end portion) of the spindle 8 by a flange mechanism 14a (see FIG. 3B) and a nut 16. When the spindle 8 is rotated, the cutting blade 14 is rotated in a rotating direction 14c. The cutting blade 14 includes an annular base 12 having a through-hole (not depicted) in the center thereof, and an annular cutting grindstone 14b fixed to the base 12. The cutting grindstone 14b is formed by dispersing abrasive grains of diamond or the like in a binder. Note that the two structural bodies 9 formed on the metal 7a of the substrate 1 mentioned above are formed in such a manner that the distance between the two structural bodies 9 is equal to or smaller than the thickness of the cutting grindstone 14b of the cutting blade 14.

In the cutting step, first, the substrate 1 is placed on the holding surface 4a of the chuck table 4 in such a manner that the front surface 1a, where the metal 7a is not disposed, of the substrate 1 having the metal 7a exposed is directed to the holding surface 4a. Next, the suction source of the chuck table 4 is operated to apply a negative pressure to the substrate 1, thereby holding the substrate 1 on the chuck table 4 by suction. As a result, the metal 7a disposed on the back surface 1b of the substrate 1 is exposed to the upper side. Then, the chuck table 4 is rotated to align the cutting line 3 on the substrate 1 to the processing feed direction 4b of the chuck table 4. Thereafter, the cutting unit 6 and the chuck table 4 are moved in such a manner that the cutting grindstone 14b of the cutting blade 14 is positioned at a position on the upper side of an extension line of the cutting line 3.

The spindle 8 is rotated, whereby the cutting blade 14 is rotated in the rotating direction 14c, and the cutting unit 6 is lowered in such a manner that the lower end of the cutting grindstone 14b is positioned at a position where it can cut the substrate 1. Then, the chuck table 4 is put into processing feeding in the processing feed direction 4b. As a result, the cutting grindstone 14b of the cutting blade 14 is made to cut into the substrate 1 and the metal 7a along the cutting line 3, whereby cutting of the substrate 1 and the metal 7a is performed. In this instance, the cutting grindstone 14b of the cutting blade 14 passes a region between the two structural bodies 9. After the cutting blade 14 has cut the substrate 1 along one cutting line 3, indexing feeding of the substrate 1 is conducted, and cutting is successively conducted along the adjacent cutting lines 3. After the cutting along the cutting lines 3 aligned along one direction has been conducted, the chuck table 4 is rotated to change the processing feed direction of the substrate 1, and cutting is conducted along the cutting lines 3 aligned along the other direction. When the substrate 1 has been cut along all the cutting lines 3, individual device chips are formed, and the cutting step is completed.

As depicted in FIG. 3B, when the substrate 1 having the metal 7a exposed is cut by the cutting blade 14, the cut groove 11 is formed along the cutting line 3. The two structural bodies 9 are disposed on the upper side of the wall surfaces 7b exposed to the cut groove 11. While burr extends from the wall surface 7b upon cutting of the metal 7a, the burr is clamped and crushed between the structural bodies 9 and the cutting grindstone 14b of the cutting blade 14, thereby being removed, so that the burr is not left on the wall surface 7b. If the two structural bodies 9 are not formed on the upper side of the wall surfaces 7b, the burr would not be crushed but be left on the wall surface 7b; in this case, for example, when the formed device chip is mounted to a predetermined object of mounting, the burr may interfere with the object to hamper appropriate mounting of the device chip. In addition, there is a fear that the burr extends in such a manner as to interconnect electrodes of the device chip, thereby causing a short-circuit between the electrodes. Further, the burr formed may fall off to adhere to the device chip or the cutting apparatus 2. On the other hand, in the processing method according to the present embodiment, the two structural bodies 9 are each disposed on the upper side of both wall surfaces 7b of the metal 7a exposed to the region to be removed by cutting by the cutting blade 14, and, therefore, the burr is not left on the wall surface 7b.

After the cutting step is conducted, a structural body removing step of removing the two structural bodies 9 on the metal 7a may be carried out. The structural bodies 9 are removed by grinding with a grindstone, or by polishing with a polishing pad, the substrate 1 having been subjected to the cutting step. The structural bodies 9 may be removed by wet etching or dry etching.

Note that the present invention is not limited to the description of the above embodiment, and can be carried out with various modifications. For example, while the two structural bodies 9 have been formed on the metal 7a of the substrate 1 having the metal 7a exposed, along each cutting line 3, in the above embodiment, a mode of the present invention is not limited to this. For example, one structural body 9 having a large width may be formed on the metal 7a in such a manner as to cover entirely the upper side of the region in which the cut grooves 11 are to be formed by cutting. In this case, when the substrate 1 is cut, the one structural body 9 is cut to be divided into two structural bodies 9, and the burr generated from the wall surface 7b of the metal 7a is crushed between the two structural bodies 9 and the cutting blade 14.

In addition, the substrate having the metal exposed which is the workpiece in the processing method according to a mode of the present invention may be a metallic substrate, as aforementioned. In the case where the substrate having the metal exposed is a metallic substrate, two structural bodies are disposed on the metal of the metallic substrate along respective edges in regard of the width direction of the cutting line. Then, the cutting blade is made to cut into the metallic substrate from between the two structural bodies to cut the metallic substrate along the cutting line.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a substrate having a metal exposed and having cutting lines of a predetermined width set thereon, the processing method comprising:
   a structural body disposing step of disposing two structural bodies on the metal along respective edges in regard of width direction of the cutting line, with a gap corresponding to the width therebetween; and
   a cutting step of causing a cutting blade to cut into the substrate from between the two structural bodies to cut the substrate along the cutting lines, after the structural body disposing step is carried out.

2. The processing method for the substrate having the metal exposed according to claim 1,
   wherein the cutting blade has an annular cutting grindstone, and
   a distance between the two structural bodies is equal to or smaller than a thickness of the cutting grindstone.

* * * * *